United States Patent
Sakano et al.

(10) Patent No.: US 7,119,634 B2
(45) Date of Patent: Oct. 10, 2006

(54) SURFACE ACOUSTIC WAVE DEMULTIPLEXER USING DIFFERENT PIEZOELECTRIC MATERIALS FOR SUBSTRATES OF TWO SAW FILTERS

(75) Inventors: Kiwamu Sakano, Ishikawa-ken (JP); Ryoichi Omote, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 109 days.

(21) Appl. No.: 10/882,365

(22) Filed: Jul. 2, 2004

(65) Prior Publication Data

US 2005/0017823 A1    Jan. 27, 2005

(30) Foreign Application Priority Data

Jul. 25, 2003    (JP) ............................. 2003-201966
Apr. 27, 2004    (JP) ............................. 2004-130818

(51) Int. Cl.
*H03H 9/72* (2006.01)
*H03H 9/64* (2006.01)

(52) U.S. Cl. ..................................... 333/133; 333/193
(58) Field of Classification Search ................. 333/133
See application file for complete search history.

(56) References Cited

U.S. PATENT DOCUMENTS 5,202,652 A * 4/1993 Tabuchi et al. ............. 333/193
6,339,365 B1 * 1/2002 Kawase et al. ............. 333/193
6,556,100 B1 * 4/2003 Takamine ................... 333/133
6,606,016 B1 * 8/2003 Takamine ................... 333/133
6,798,121 B1 * 9/2004 Nakatani et al. ............ 310/340
6,975,180 B1 * 12/2005 Nakamura et al. .......... 333/133
2003/0076194 A1   4/2003 Machui ...................... 333/133

FOREIGN PATENT DOCUMENTS

| JP | 04-284713 | 10/1992 |
| JP | 07-066679 | 10/1995 |
| JP | 08-032402 | 2/1996 |
| JP | 11-340781 | 12/1999 |
| JP | 2003-517239 | 5/2003 |

* cited by examiner

*Primary Examiner*—Barbara Summons
(74) *Attorney, Agent, or Firm*—Keating & Bennett, LLP

(57) ABSTRACT

A surface acoustic wave demultiplexer includes a first surface acoustic wave filter, a second surface acoustic wave filter having a higher center frequency than the first surface acoustic wave filter, and a one-port surface acoustic wave resonator connected to an input terminal of the first surface acoustic wave filter in series and having an anti-resonant frequency in the stop band of the first surface acoustic wave filter. A first piezoelectric substrate that constitutes the first surface acoustic wave filter and a second piezoelectric substrate that constitutes the second surface acoustic wave filter are made from different piezoelectric materials.

18 Claims, 8 Drawing Sheets ant frequency of the one-port surface acoustic wave resonator can be sufficiently large. Accordingly, in a frequency characteristic of the first surface acoustic wave filter, suffi-

SURFACE ACOUSTIC WAVE DEMULTIPLEXER USING DIFFERENT PIEZOELECTRIC MATERIALS FOR SUBSTRATES OF TWO SAW FILTERS

BACKGROUND OF THE INVENTION

1. Field of the Invention

The present invention generally relates to a surface acoustic wave device used as a branching filter for, for example, cell phones and, in particular, to a surface acoustic wave demultiplexer having a first surface acoustic wave filter and a second surface acoustic wave filter which have different resonant frequencies and a trap including a one-port surface acoustic wave resonator connected to one of the surface acoustic wave filters.

2. Description of the Related Art

In recent years, sizes of telecommunications devices, such as cell phones, have been reduced. Various types of surface acoustic wave demultiplexers including a surface acoustic wave filter have been proposed since such surface acoustic wave demultiplexers are suitable for miniaturization in telecommunications devices.

For example, Japanese Patent No. 3224129 discloses a surface acoustic wave demultiplexer 101, whose plan view is shown in FIG. 8. The surface acoustic wave demultiplexer 101 includes first and second surface acoustic wave filter chips 103 and 104, respectively, having different resonant frequencies in a package 102. Herein, a center frequency of the surface acoustic wave filter chip 103 is lower than that of the surface acoustic wave filter chip 104. Each of the surface acoustic wave filter chips 103 and 104 includes a $LiTaO_3$ substrate.

When the surface acoustic wave demultiplexer 101 is used in a cell phone, the first and second surface acoustic wave filter chips 103 and 104 are used as a transmission filter and a reception filter, respectively.

In the surface acoustic wave demultiplexer disclosed in Japanese Patent No. 3224129, the first and second surface acoustic wave filter chips 103 and 104 are composed of $LiTaO_3$ substrates.

In general, in a surface acoustic wave demultiplexer, different characteristics are required for surface acoustic wave filters for transmission and reception. However, the surface acoustic wave filters with different characteristics affect each other greatly.

In particular, in telecommunications systems including a personal digital cellular (PDC) in which the pass bands for transmission and reception are significantly different, piezoelectric substrates composed of the same piezoelectric material sometimes do not provide sufficient performance.

If the first and second surface acoustic wave filters for reception and transmission are composed of piezoelectric substrates made from the same piezoelectric material, it is difficult to have superior characteristics for both surface acoustic wave filters.

SUMMARY OF THE INVENTION

In order to overcome the problems described above, preferred embodiments of the present invention provide a surface acoustic wave demultiplexer including first and second surface acoustic wave filters which exhibit superior characteristics.

According to a preferred embodiment of the present invention, a surface acoustic wave demultiplexer includes a first surface acoustic wave filter having an input terminal and an output terminal, a second surface acoustic wave filter having an input terminal and an output terminal and having a higher center frequency than the first surface acoustic wave filter, and a one-port surface acoustic wave resonator connected to the input terminal of the first surface acoustic wave filter in series and having an anti-resonant frequency in the stop band of the first surface acoustic wave filter. In this surface acoustic wave demultiplexer, a first piezoelectric substrate of the first surface acoustic wave filter and a second piezoelectric substrate of the second surface acoustic wave filter include different piezoelectric materials.

Preferably, in the surface acoustic wave demultiplexer, the electromechanical coefficient of a third piezoelectric substrate of the one-port surface acoustic wave resonator is higher than that of the first piezoelectric substrate.

Preferably, in the surface acoustic wave demultiplexer, the electromechanical coefficient of the second piezoelectric substrate is the same as that of the third piezoelectric substrate of the one-port surface acoustic wave resonator.

Furthermore, in the surface acoustic wave demultiplexer according to various preferred embodiments of the present invention, the second piezoelectric substrate and the third piezoelectric substrate surface are preferably integrated such that the second surface acoustic wave filter and the one-port surface acoustic wave resonator are disposed on a single piezoelectric substrate. Additionally, the surface acoustic wave demultiplexer preferably includes a package in which a first chip component that constitutes the first surface acoustic wave filter and a second chip component that constitutes the second surface acoustic wave filter and the one-port surface acoustic wave resonator are mounted. Also, the first piezoelectric substrate and a piezoelectric substrate of the one-port surface acoustic wave resonator are preferably integrated such that the first surface acoustic wave filter and the one-port surface acoustic wave resonator are disposed on a single piezoelectric substrate to define a chip component.

As described above, according to preferred embodiments of the present invention, a surface acoustic wave demultiplexer includes a first surface acoustic wave filter having an input terminal and an output terminal, a second surface acoustic wave filter having an input terminal and an output terminal and having a higher center frequency than the first surface acoustic wave filter; and a one-port surface acoustic wave resonator connected to the input terminal of the first surface acoustic wave filter in series and having an anti-resonant frequency in the stop band of the first surface acoustic wave filter. In the surface acoustic wave demultiplexer, a first piezoelectric substrate of the first surface acoustic wave filter and a second piezoelectric substrate of the second surface acoustic wave filter include different piezoelectric materials.

Accordingly, since piezoelectric materials for the first and second piezoelectric substrates can be selected in accordance with required characteristics for the first and second surface acoustic wave filters, superior frequency characteristics can be achieved compared to using the same material for both first and second piezoelectric substrates.

In the surface acoustic wave demultiplexer according to preferred embodiments of the present invention, if an electromechanical coefficient of the piezoelectric substrate which constitutes the one-port surface acoustic wave resonator is higher than that of the first piezoelectric substrate, a distance between a resonant frequency and an anti-resocient attenuation in the stop band, in particular, in the pass band of the second surface acoustic wave filter, can be achieved in a wider frequency range. As a result, an insertion loss of the second surface acoustic wave filter in the stop band of the first surface acoustic wave filter can be decreased. Also, the isolation characteristic can be improved.

According to preferred embodiments of the present invention, to have a higher electromechanical coefficient of a piezoelectric substrate that constitutes a one-port surface acoustic wave resonator than that of the first piezoelectric substrate, for example, the first piezoelectric substrate could be made from $LiTaO_3$ and a piezoelectric substrate for the one-port surface acoustic wave resonator could be made from $LiNbO_3$. Since $LiNbO_3$ has a higher electromechanical coefficient than $LiTaO_3$, a large attenuation can be easily obtained in the frequency range far from the pass band. Other materials for the first and second piezoelectric substrates can also be used.

In the surface acoustic wave demultiplexer according to preferred embodiments of the present invention, if the electromechanical coefficient of the second piezoelectric substrate is the same as that of the third piezoelectric substrate of the one-port surface acoustic wave resonator, a temperature characteristic of attenuation pole of the one-port surface acoustic wave resonator is identical to a temperature characteristic in the pass band of the second surface acoustic wave filter. Accordingly, an insertion loss in the pass band of the second surface acoustic wave filter caused by environmental temperature variation can be minimized. In addition, signal leakage from an input terminal of the second surface acoustic wave filter to an output terminal of the first surface acoustic wave filter can be prevented, thus improving the isolation characteristic.

If the second piezoelectric substrate and the third piezoelectric substrate are integrated such that the second surface acoustic wave filter and the one-port surface acoustic wave resonator are disposed on a single piezoelectric substrate to define a one chip component, the surface acoustic wave demultiplexer can be miniaturized and the number of parts and the cost can be reduced.

If the surface acoustic wave demultiplexer includes a package in which a first chip component that constitutes the first surface acoustic wave filter and a second chip component that constitutes the second surface acoustic wave filter and the one-port surface acoustic wave resonator are mounted, a small surface acoustic wave demultiplexer can be provided.

According to preferred embodiments of the present invention, a piezoelectric substrate of the one-port surface acoustic wave resonator and the first piezoelectric substrate may be integrated such that the first surface acoustic wave filter and the one-port surface acoustic wave resonator are disposed on a single piezoelectric substrate. Even in this case, since the first piezoelectric substrate and the second piezoelectric substrate are composed of different materials, the first and second surface acoustic wave filters can have superior characteristics.

Since a surface acoustic wave demultiplexer module according to various preferred embodiments of the present invention includes the surface acoustic wave demultiplexer according to the present invention, piezoelectric materials for the first and second piezoelectric substrates can be selected in accordance with required characteristics for the first and second surface acoustic wave filters. As a result, superior frequency characteristics can be achieved.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Preferred embodiments of the present invention will now be described with reference to the accompanying drawings.

Figure 1A:
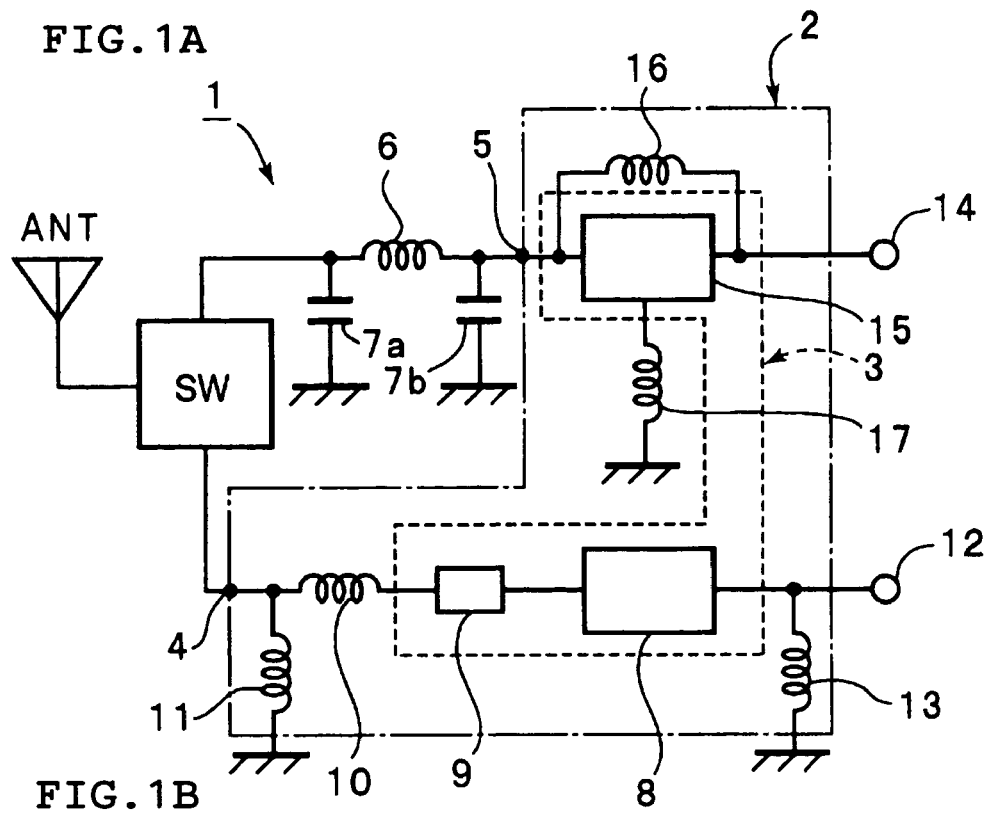
FIG. 1A is a circuit diagram of a surface acoustic wave demultiplexer connected to an antenna.
Figure 1B:
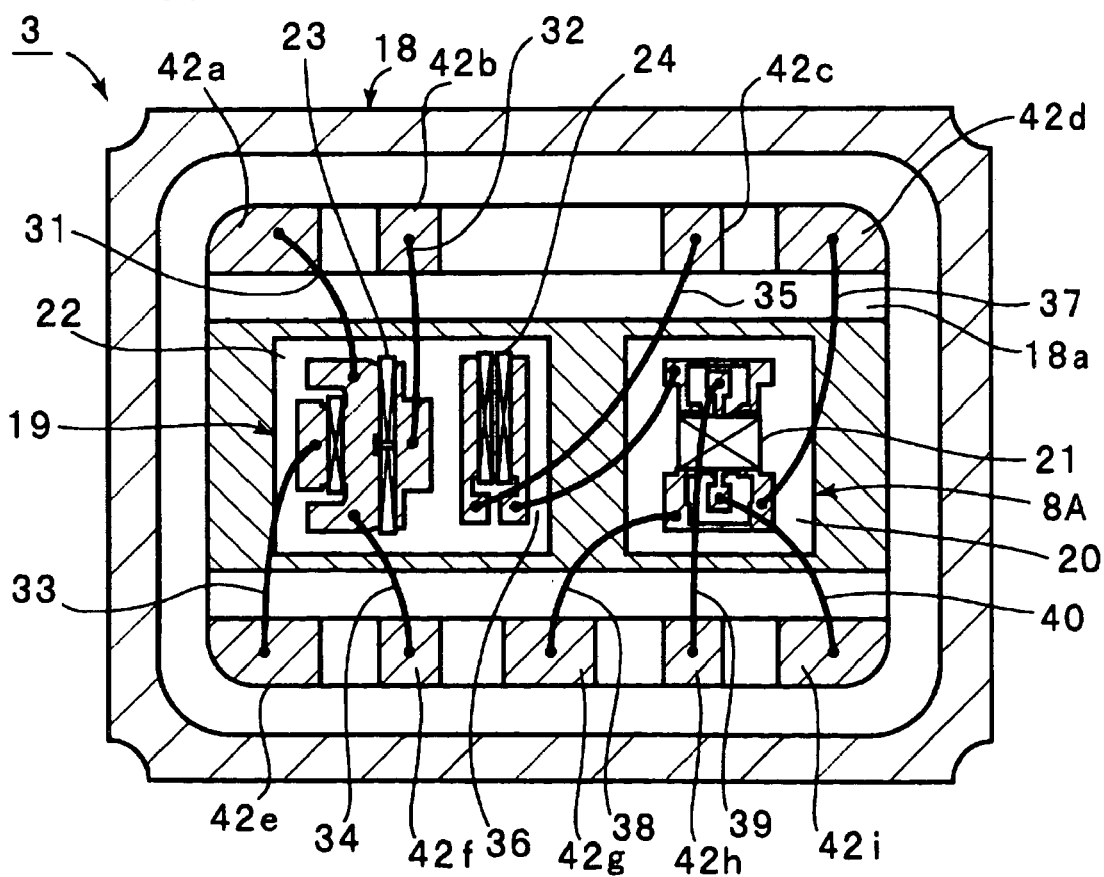
FIG. 1B is a plan view of the surface acoustic wave demultiplexer when a cover is removed according to a preferred embodiment of the present invention.

FIG. 1A is a circuit diagram of a telecommunications device including a surface acoustic wave demultiplexer according to a preferred embodiment of the present invention. FIG. 1B is a plan view of the surface acoustic wave demultiplexer.

With reference to FIG. 1A, a telecommunications device 1 includes a switch SW connected to an antenna ANT. A surface acoustic wave demultiplexer module 2 shown by a chain line is connected to the switch SW. A portion surrounded by a dashed line in the surface acoustic wave demultiplexer module 2 defines a surface acoustic wave demultiplexer 3 according to this preferred embodiment.

The surface acoustic wave demultiplexer module 2 includes a first antenna terminal 4 and a second antenna terminal 5. The first antenna terminal 4 is connected to the switch SW. The second antenna terminal 5 is connected to the switch SW via an inductor 6. A capacitor 7a is grounded at an end adjacent to the switch SW of the inductor 6, whereas a capacitor 7b is grounded at an end adjacent to the antenna terminal 5 of the inductor 6.

Furthermore, an input terminal of a first surface acoustic wave filter 8 is connected to the first antenna terminal 4 of the surface acoustic wave demultiplexer module 2. In this preferred embodiment, the first surface acoustic wave filter 8 functions as a reception filter. Between the input terminal of the first surface acoustic wave filter 8 and the first antenna terminal 4, a one-port surface acoustic wave resonator 9 is connected to the first surface acoustic wave filter 8 in series. An inductor 10 is connected with both the one-port surface acoustic wave resonator 9 and the antenna terminal 4. An inductor 11 is grounded from a connection point between the first antenna terminal 4 and the inductor 10. The inductors 10 and 11 are provided for an impedance matching of the surface acoustic wave filter 8.

In this preferred embodiment, the first surface acoustic wave filter 8 is preferably a longitudinally coupled resonator type surface acoustic wave filter. An output terminal of the first surface acoustic wave filter 8 is connected to a receiving port 12 of the surface acoustic wave demultiplexer module 2. An inductor 13 is grounded from a connection point between the first surface acoustic wave filter 8 and the receiving port 12.

A second surface acoustic wave filter 15 functioning as a transmission filter is connected between the second antenna terminal 5 and a transmitting port 14. The center frequency of the second surface acoustic wave filter 15 is higher than that of the first surface acoustic wave filter 8. An inductor 16 is connected to the second surface acoustic wave filter 15 in parallel. Additionally, an inductor 17 is grounded from the second surface acoustic wave filter 15. More specifically, the second surface acoustic wave filter 15 is preferably a ladder surface acoustic wave filter having serial-branch resonators and parallel-branch resonators. The inductor 16 is connected to one of the serial-branch resonators in parallel, while the inductor 17 is connected to one of the parallel-branch resonators in series.

FIG. 1B is a plan view of the surface acoustic wave demultiplexer 3 included in the surface acoustic wave demultiplexer module 2 shown in FIG. 1A.

With reference to FIG. 1B, the surface acoustic wave demultiplexer 3 includes a package 18. The package 18 has an opening 18a on its top surface. The first and second surface acoustic wave filters 8 and 15 are disposed in the opening 18a. In this preferred embodiment, the first surface acoustic wave filter 8 is a first chip component 8A disposed in the opening 18a of the package 18. The second surface acoustic wave filter 15 and the one-port surface acoustic wave resonator 9 are integrated as a second chip component 19 disposed in the opening 18a.

An electrode 21 (schematically shown) is disposed on a first piezoelectric substrate 20 to define the first chip component 8A. Herein, the electrode 21 functions as an electrode of a longitudinally coupled resonator type surface acoustic wave filter. The first piezoelectric substrate 20 is preferably a LiTaO$_3$ substrate.

In the second chip component 19, an electrode 23 of the second surface acoustic wave filter 15 and an electrode 24 of the one-port surface acoustic wave resonator 9 are disposed on a second piezoelectric substrate 22. Although the electrode 23 is schematically shown in FIG. 1B, as described above, the second surface acoustic wave filter 15 is preferably a ladder surface acoustic wave filter and the above-described inductor 16 is connected to one of the serial-branch resonators in parallel. The inductor 17 is connected to one of the parallel-branch resonators in series.

The second piezoelectric substrate 22 is preferably a LiNbO$_3$ substrate. That is, in this preferred embodiment, the second surface acoustic wave filter 15 functioning as a transmission filter and the one-port surface acoustic wave resonator 9 are disposed on the single second piezoelectric substrate 22 to define the single chip component 19.

In the surface acoustic wave demultiplexer 3 according to the present preferred embodiment, the first surface acoustic wave filter 8 is preferably a longitudinally coupled resonator type surface acoustic wave filter. The second surface acoustic wave filter 15 is preferably a ladder surface acoustic wave filter in which an inductor is connected to a serial-branch resonator in parallel and an inductor is connected to a parallel-branch resonator in series. Additionally, the one-port surface acoustic wave resonator 9, which has an antiresonant frequency in the stop band of the first surface acoustic wave filter 8, namely, in the pass band of the second surface acoustic wave filter 15, is connected to the input terminal of the first surface acoustic wave filter 8 in series. Consequently, the attenuation in the stop band of the first surface acoustic wave filter 8 is increased.

One of the unique features of this preferred embodiment is that the first piezoelectric substrate 20 of the first surface acoustic wave filter 8 is a LiTaO$_3$ substrate and the second piezoelectric substrate 22 of the second surface acoustic wave filter 15 is a LiNbO$_3$ substrate. Thus, the first piezoelectric substrate 20 and the second piezoelectric substrate 22 are made of different materials.

In general, compared to a LiNbO$_3$ substrate, a LiTaO$_3$ substrate has a small variation in frequency as the temperature varies. Accordingly, LiTaO$_3$ substrates have been used as piezoelectric substrates for both reception filters and transmission filters.

In contrast, in this preferred embodiment, the second surface acoustic wave filter 15, which is a transmission filter, preferably has a LiNbO$_3$ substrate. In the case where transmission frequency is far from reception frequency, a transmission surface acoustic wave filter, for example, requires large attenuation in the stop band far from the pass band. To achieve such large attenuation, a surface acoustic wave resonator filter has an advantage over a surface acoustic wave filter having a ladder circuit configuration. Unfortunately, since a transmission surface acoustic wave filter requires high power resistance, a surface acoustic wave resonator filter, which has low power resistance, cannot be used. Therefore, in this preferred embodiment, a ladder surface acoustic wave filter is used for the second surface acoustic wave filter 15, which is a transmission filter. Furthermore, a LiNbO$_3$ substrate is used, since large attenuation can be obtained in the frequency band far from the pass band. That is, according to this preferred embodiment, since the LiNbO$_3$ substrate having a higher electromechanical coefficient than a LiTaO$_3$ substrate is used, the second surface acoustic wave filter 15 can provide large attenuation in the stop band.

In the case of using a LiNbO$_3$ substrate instead of a LiTaO$_3$ substrate and forming an Al electrode on the substrate, the degree of crystallinity of the electrode film is increased. Accordingly, the LiNbO$_3$ substrate provides more power resistance than the LiTaO$_3$ substrate. That is, the second surface acoustic wave filter 15 including the LiNbO$_3$ substrate can provide increased power resistance and large attenuation in the stop band.

In addition, in this preferred embodiment, the one-port surface acoustic wave resonator 9, which is connected to the first surface acoustic wave filter 8, preferably includes a LiNbO$_3$ substrate. Accordingly, a temperature characteristic in the stop band of the first surface acoustic wave filter is identical to a temperature characteristic in the pass band of the second surface acoustic wave filter. Thus, an insertion loss in the pass band of the second surface acoustic filter caused by environmental temperature variation can be reduced. In addition, signal leakage from the transmitting port 14, which is an input terminal of the second surface acoustic wave filter 15, to the receiving port 12, which is an output terminal of the first surface acoustic wave filter 8, can be prevented, thus improving the isolation characteristic.

Since the one-port surface acoustic wave resonator 9 is preferably composed of a LiNbO$_3$ substrate having a high electromechanical coefficient, an impedance in the stop band of the first surface acoustic wave filter 8 can be nearly open in a wide frequency range and, therefore, an impedance matching of the second surface acoustic wave filter 15, which is a transmission surface acoustic wave filter, can be easily achieved.

In the above-described preferred embodiment, the one-port surface acoustic wave resonator 9 includes the second piezoelectric substrate. Alternatively, the one-port surface acoustic wave resonator 9 may include another piezoelectric substrate, i.e., third piezoelectric substrate made of LiNbO$_3$ instead of the second piezoelectric substrate 22. That is, the one-port surface acoustic wave resonator may be a different chip component from the chip component that constitutes the second surface acoustic wave filter 15. However, as in the above-described preferred embodiment, the second surface acoustic wave filter 15 and the one-port surface acoustic wave resonator 9 are preferably composed of the same LiNbO$_3$ substrate to define a one chip component and, thereby, the surface acoustic wave demultiplexer 3 can be miniaturized and the number of parts can be reduced.

As described above, in the surface acoustic wave demultiplexer 3 according to the present preferred embodiment, sufficient attenuation can be achieved in the stop band of the first surface acoustic wave filter 8, which functions as a reception surface acoustic wave filter. This will now be described with reference to FIG. 2.

Figure 2:
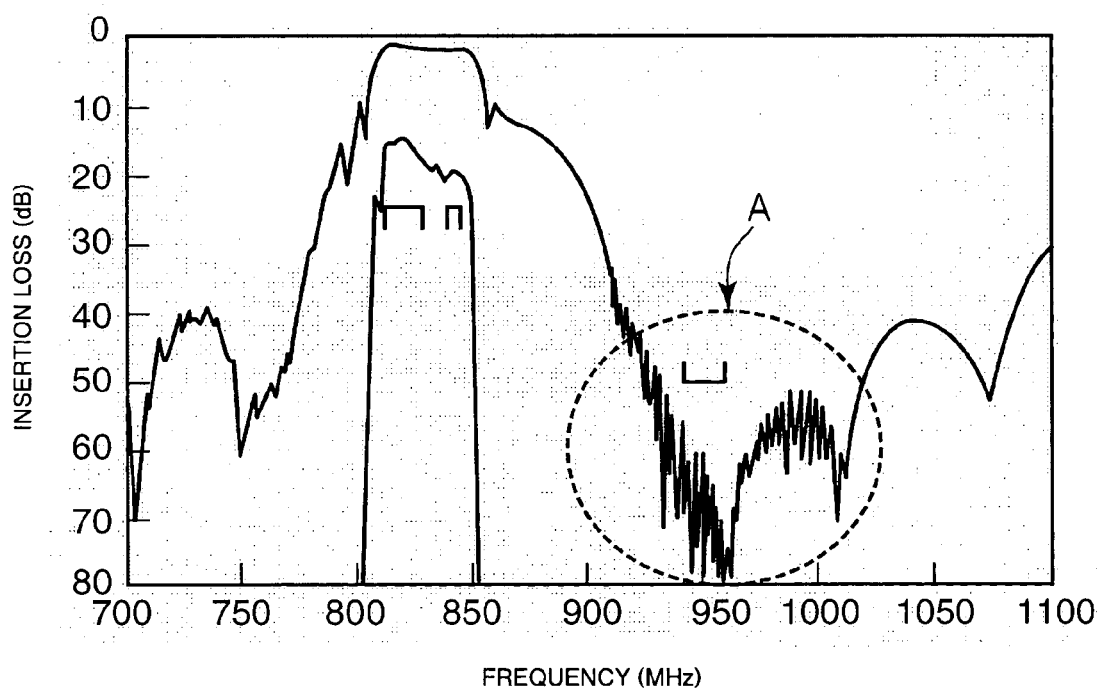
FIG. 2 is a graph of an attenuation-frequency characteristic of a reception surface acoustic wave filter of the surface acoustic wave demultiplexer according to a preferred embodiment of the present invention.

FIG. 2 shows an attenuation-frequency characteristic of a reception surface acoustic wave filter of the surface acoustic wave demultiplexer 3 according to this preferred embodiment. In this preferred embodiment, the pass band of the reception surface acoustic wave filter ranges from about 810 MHz to 828 MHz, while the pass band of the second surface acoustic wave filter 15, which is a transmission surface acoustic wave filter, ranges from about 940 MHz to 958 MHz. Since the above-described one-port surface acoustic wave resonator is provided on a LiNbO$_3$ substrate, the sufficient attenuation is achieved in the stop band shown by arrow A.

The surface acoustic wave demultiplexer 3 having the characteristic shown in FIG. 2 preferably has the following requirements. The surface acoustic wave demultiplexer 3 according to the present preferred embodiment is preferably designed for PDCs. The insertion loss of the first surface acoustic wave filter 8 is smaller than or equal to about 2 dB in a frequency range of from 810 MHz to 828 MHz and is greater than or equal to about 50 dB in a frequency band of from 940 MHz to 958 MHz. The insertion loss of the second surface acoustic wave filter 15 is smaller than or equal to about 1 dB in a frequency range of from 940 MHz to 958 MHz and is greater than or equal to about 40 dB in a frequency range of from 810 MHz to 828 MHz.

In the above-described preferred embodiment, the one-port surface acoustic wave resonator 9 is preferably disposed on the same piezoelectric substrate as the second surface acoustic wave filter 15, namely, on the second piezoelectric substrate 22. Alternatively, according to other preferred embodiments of the present invention, the one-port surface acoustic wave resonator 9 may be disposed on a LiTaO$_3$ substrate. That is, a one-port surface acoustic wave resonator may be disposed on the first piezoelectric substrate 20, which constitutes the first surface acoustic wave filter 8. Thus, FIG. 3 shows an attenuation-frequency characteristic of a reception surface acoustic wave filter of a surface acoustic wave device in which a one-port surface acoustic wave resonator is disposed on the first piezoelectric substrate 20 and other structures are the same.

Figure 3:
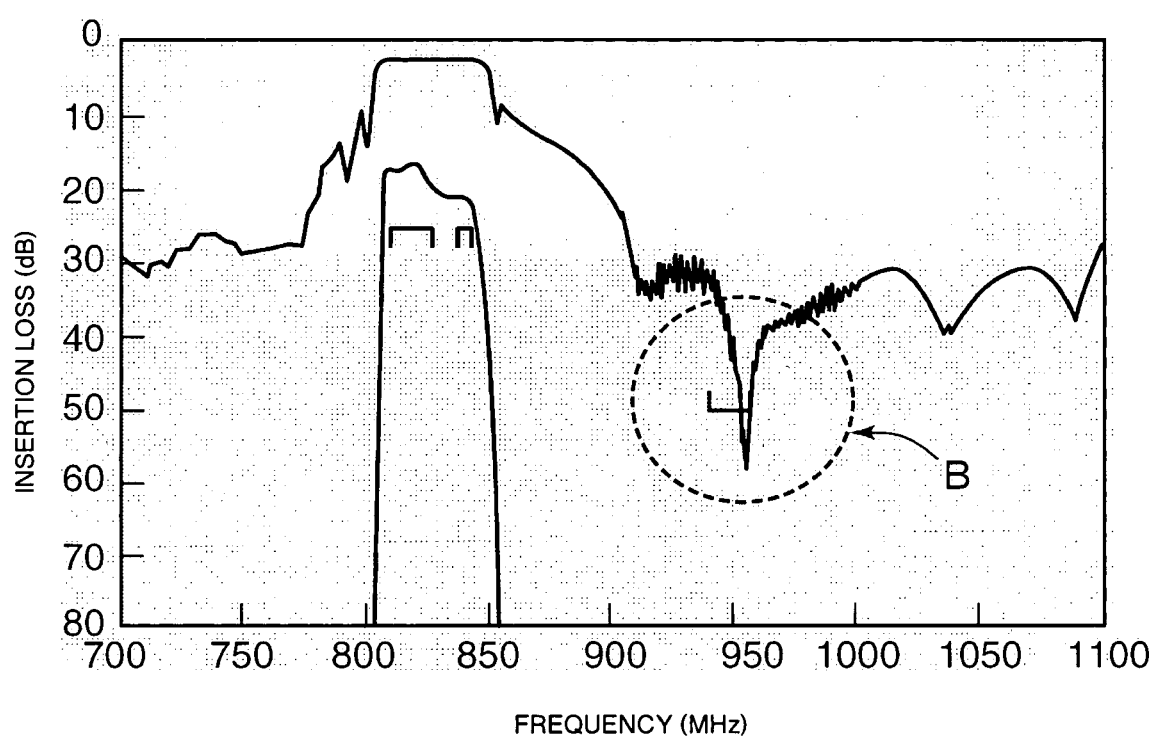
FIG. 3 is a graph of an attenuation-frequency characteristic of a first surface acoustic wave filter, which is a reception surface acoustic wave filter of the surface acoustic wave demultiplexer according to a modification of preferred embodiments of the present invention.

As can be seen by comparing a characteristic shown by arrow B in FIG. 3 with a characteristic shown by arrow A in FIG. 2, in the case where a one-port surface acoustic wave resonator is disposed on the first piezoelectric substrate, sufficient attenuation cannot be achieved in the stop band compared to the characteristic shown in FIG. 2. However, since the second surface acoustic wave filter includes a LiNbO$_3$ substrate having a higher electromechanical coefficient than a LiTaO$_3$ substrate, a large attenuation can be achieved in the stop band of the second surface acoustic wave filter 15.

In the above-described preferred embodiment, the one-port surface acoustic wave resonator 9 is disposed on the second piezoelectric substrate which constitutes the second surface acoustic wave filter, that is, the one-port surface acoustic wave resonator is disposed on the LiNbO$_3$ substrate having a higher electromechanical coefficient than a LiTaO$_3$ substrate. Accordingly, a distance between the resonant frequency and the anti-resonant frequency of the one-port surface acoustic wave resonator 9 becomes large and, therefore, as shown in FIG. 2, in the attenuation-frequency characteristic of a reception surface acoustic wave filter, sufficient attenuation over a wide frequency range in the stop band, in particular, in the pass band of the second surface acoustic wave filter, which is a transmission surface acoustic wave filter, can be achieved.

Accordingly, in various preferred embodiments of the present invention, the one-port surface acoustic wave resonator 9 is preferably disposed on a second piezoelectric substrate made of LiNbO$_3$ having a high electromechanical coefficient, as shown in FIG. 1B.

A method for fabricating the above-described surface acoustic wave demultiplexer 3 will now be described.

Figure 4:
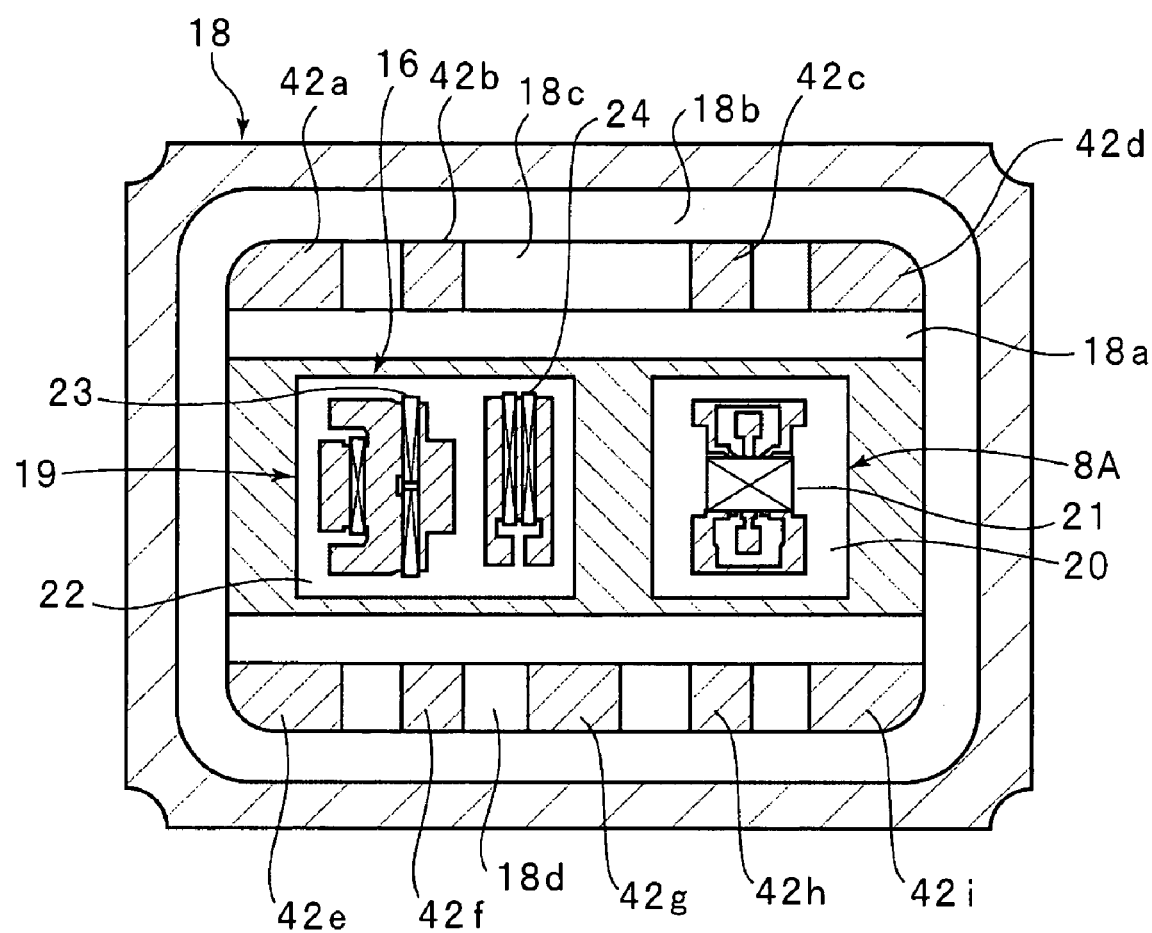
FIG. 4 is a plan view of a package according to a preferred embodiment of the present invention, in which a first chip component that constitutes a first surface acoustic wave filter and a second chip component that constitutes a second surface acoustic wave filter and a one-port surface acoustic wave resonator are mounted.

To fabricate the surface acoustic wave demultiplexer 3, a package 18 shown in FIG. 4 is first prepared. The package 18 has an opening 18*a*. On the periphery of an opening 18*a*, recess segments 18*c* and 18*d* are formed. The recess segments 18*c* and 18*d* are lower than a frame top surface 18*b* of the package 18 and higher than the bottom surface of the package 18.

Inside the opening 18*a*, a chip component 8A, which constitutes a first surface acoustic wave filter 8, and a chip component 19, which constitutes a second surface acoustic wave filter 15 and a one-port surface acoustic wave resonator 9, are disposed.

Subsequently, as shown in FIG. 1B, electrical connections are performed by using bonding wires 31 to 40. That is, the second surface acoustic wave filter 15 is electrically connected to electrode lands 42*a*, 42*b*, 42*e*, and 42*f* of the package disposed on the recess segments 18*c* and 18*d* by the bonding wires 31 to 34. In addition, the one-port surface acoustic wave resonator 9 is electrically connected to an electrode land 42*c* on the recess segment 18*c* and the first surface acoustic wave filter 8 by the bonding wires 35 and 36.

Further, the first surface acoustic wave filter 8 is electrically connected to an electrode land 42*d* on the recess segment 18*c* and electrode lands 42*g* to 42*i* on the recess segment 18*d* by the bonding wires 37 to 40, respectively.

Thereafter, a cover (not shown) is bonded to the frame top surface 18b to close the opening 18a. Thus, the interior of the package is sealed.

A plurality of terminal electrodes (not shown) electrically connected to respective electrode lands 42a to 42i is disposed on the other surface of the package 18.

Figure 5:
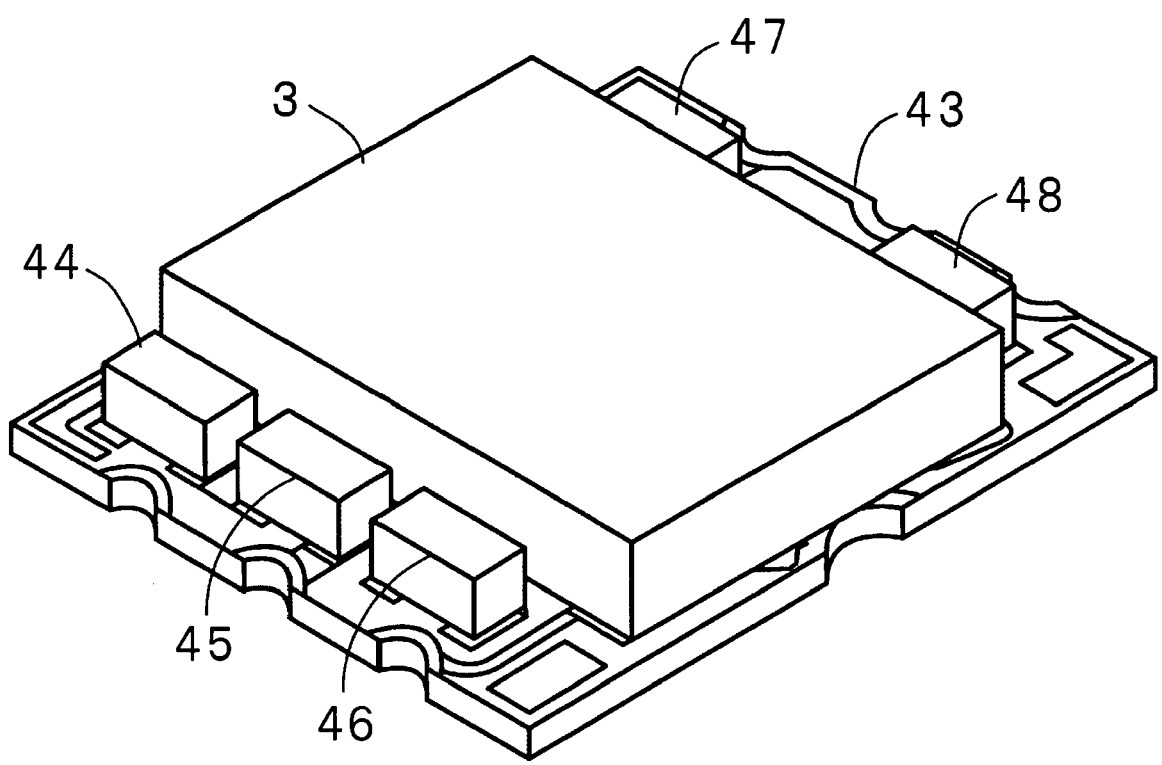
FIG. 5 is a perspective view of a surface acoustic wave demultiplexer and chip inductors mounted on a printed circuit board.

To fabricate a surface acoustic wave demultiplexer module according to preferred embodiments of the present invention, the above-described surface acoustic wave demultiplexer 3 is mounted on a printed circuit board 43 as shown in FIG. 5. Chip inductors 44 to 48 are also mounted on the printed circuit board 43. The chip inductors 44 and 45 function as the inductors 10 and 11 shown in FIG. 1A, respectively. The chip inductor 46 functions as the inductor 17 shown in FIG. 1A. Furthermore, the chip inductors 47 and 48 function as the inductors 13 and 16 shown in FIG. 1A, respectively.

Figure 6:
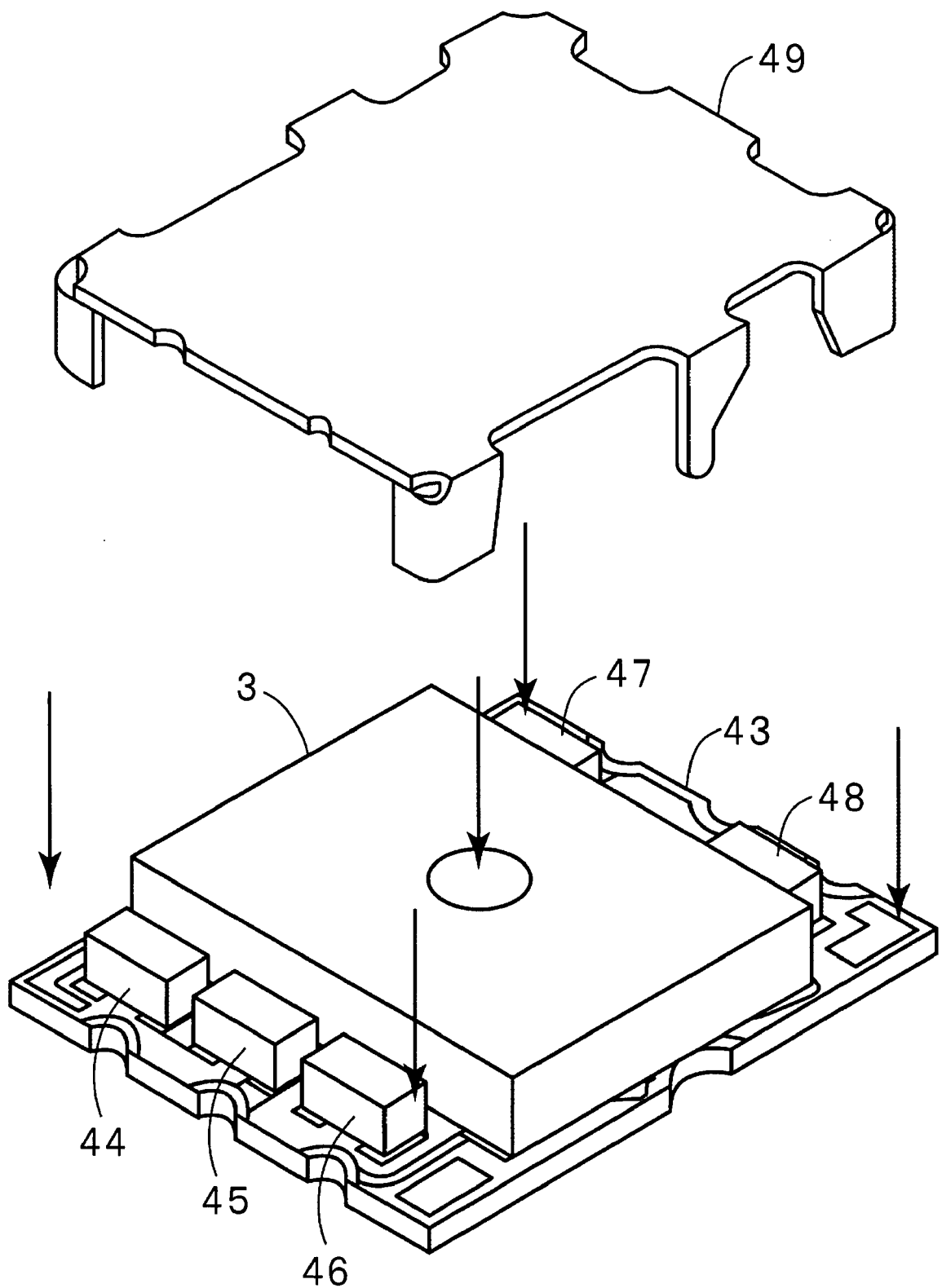
FIG. 6 is an exploded perspective view showing a step in which a cover is bonded to the surface acoustic wave demultiplexer mounted on the printed circuit board.
Figure 7:
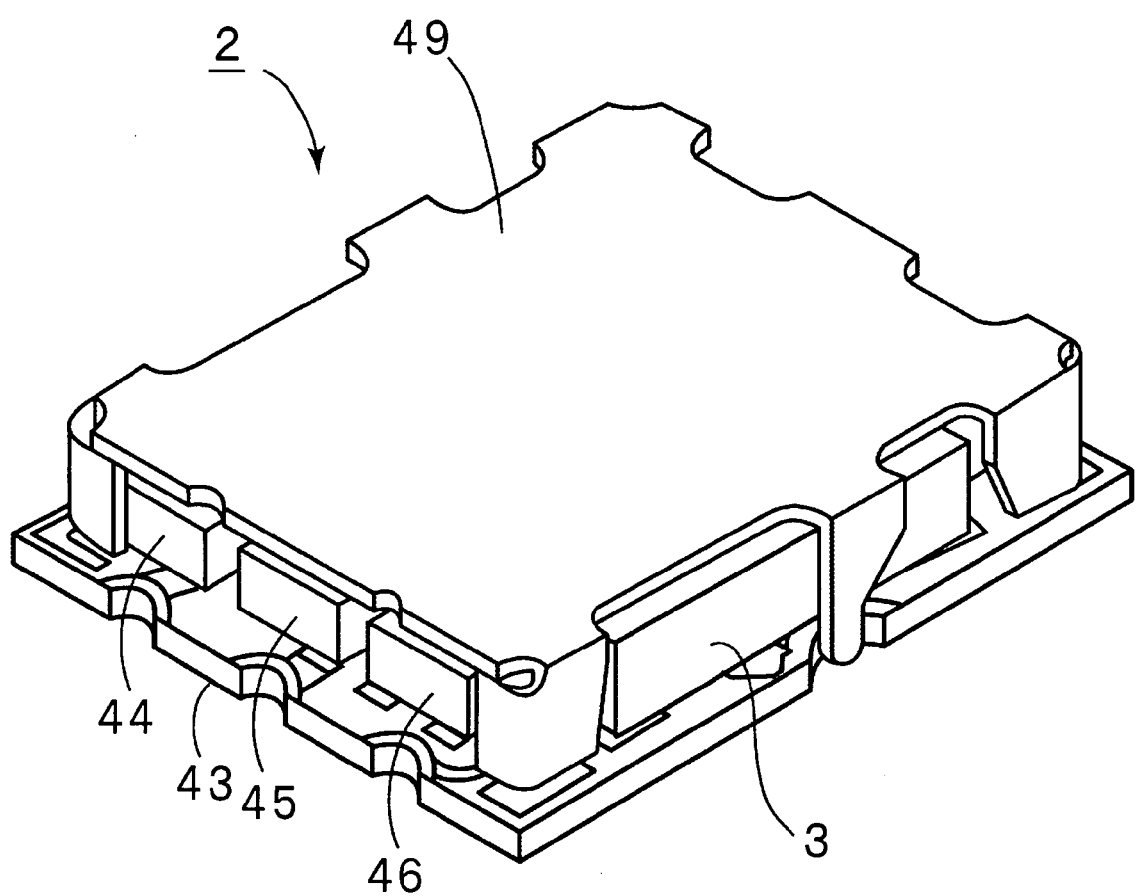
FIG. 7 is a perspective view of a surface acoustic wave demultiplexer module according to a preferred embodiment of the present invention.
Figure 8:
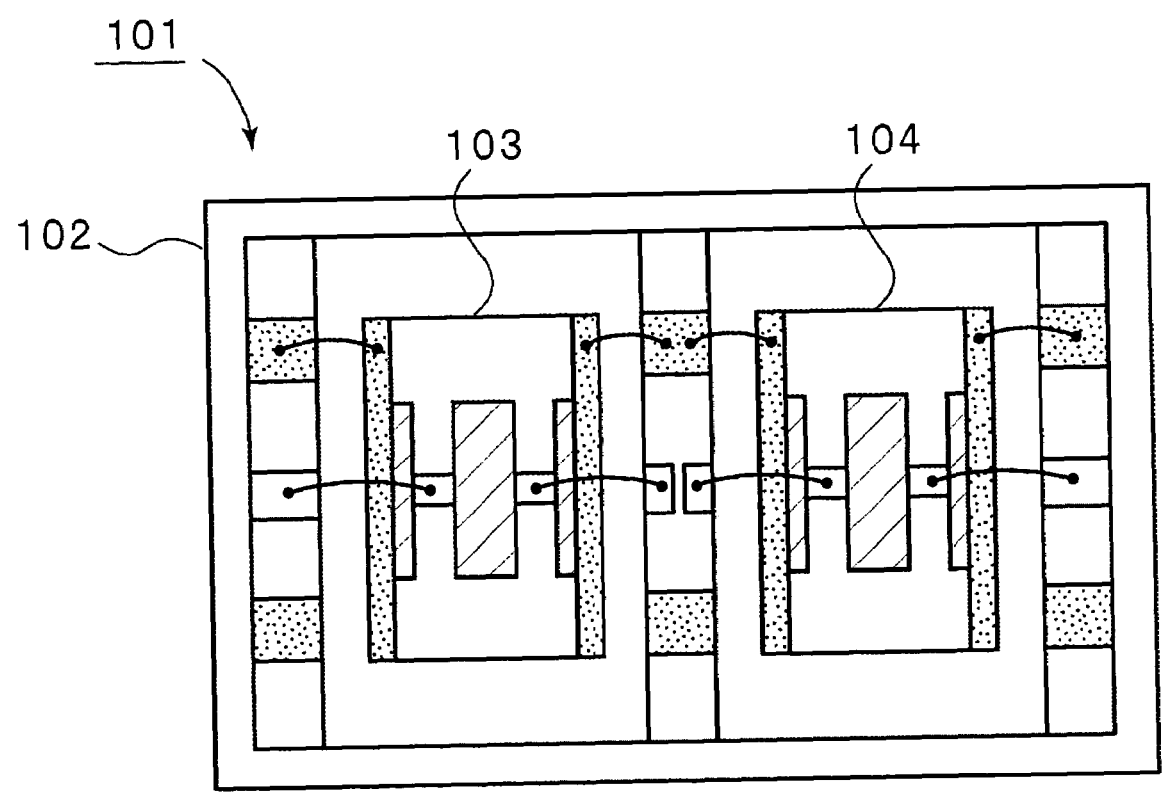
FIG. 8 shows an example of known surface acoustic wave demultiplexers.

As shown in FIG. 6, after the surface acoustic wave demultiplexer 3 and the chip inductors 44 to 48 are mounted on the printed circuit board 43, a cover 49 which covers the surface acoustic wave demultiplexer 3 is attached to the printed circuit board 43 by a conductive cementing material, such as solder. Thus, the surface acoustic wave demultiplexer module 2 shown in FIG. 7 is achieved.

This surface acoustic wave demultiplexer module 2 has a structure surrounded by a dotted line in FIG. 1A. Also, as shown in FIG. 1A, the surface acoustic wave demultiplexer module 2 is electrically connected to an antenna port ANT to function as a branching filter.

In the above-described preferred embodiment, the first piezoelectric substrate is preferably a LiTaO$_3$ substrate and the second piezoelectric substrate is preferably a LiNbO$_3$ substrate. However, according to the present invention, piezoelectric materials for the first and second piezoelectric substrates are not limited thereto.

In the above-described preferred embodiments, the chip components which constitute the first and second surface acoustic wave filters are electrically connected to the package preferably by the bonding wires. Alternatively, the chip components which constitute the first and second surface acoustic wave filters may be electrically and mechanically connected to the package by flip-chip bonding using bumps.

Additionally, in the above-described preferred embodiments, the surface acoustic wave demultiplexer module is fabricated by mounting the surface acoustic wave demultiplexer and the chip inductors on the printed circuit board. Alternatively, a package of the surface acoustic wave demultiplexer may include a multi-layered package board and inductors may be embedded in the package to allow the surface acoustic wave demultiplexer to function as a surface acoustic wave demultiplexer module.

The present invention is not limited to the above-described preferred embodiments, but can be modified in the scope of the attached claims. Further, the technologies disclosed in the above-described preferred embodiments can be used in combination, as desired.

What is claimed is:

1. A surface acoustic wave demultiplexer comprising:
   a first surface acoustic wave filter having a first piezoelectric substrate, an input terminal and an output terminal;
   a second surface acoustic wave filter having a second piezoelectric substrate, an input terminal and an output terminal, the second surface acoustic wave filter having a higher center frequency than the first surface acoustic wave filter; and
   a one-port surface acoustic wave resonator connected to the input terminal of the first surface acoustic wave filter in series and having an anti-resonant frequency in the stop band of the first surface acoustic wave filter; wherein
   the first piezoelectric substrate of the first surface acoustic wave filter and the second piezoelectric substrate of the second surface acoustic wave filter are made of different piezoelectric materials.

2. The surface acoustic wave demultiplexer according to claim 1, wherein the one-port surface acoustic wave resonator includes a third piezoelectric substrate and an electromechanical coefficient of the third piezoelectric substrate of the one-port surface acoustic wave resonator is higher than that of the first piezoelectric substrate.

3. A surface acoustic wave demultiplexer module, comprising the surface acoustic wave demultiplexer according to claim 2.

4. The surface acoustic wave demultiplexer according to claim 1, wherein the one-port surface acoustic wave resonator includes a third piezoelectric substrate and an electromechanical coefficient of the second piezoelectric substrate is the same as that of the third piezoelectric substrate.

5. The surface acoustic wave demultiplexer according to claim 4, wherein the second piezoelectric substrate and the third piezoelectric substrate surface are integrated such that the second surface acoustic wave filter and the one-port surface acoustic wave resonator are disposed on a single common piezoelectric substrate.

6. A surface acoustic wave demultiplexer module, comprising the surface acoustic wave demultiplexer according to claim 5.

7. The surface acoustic wave demultiplexer according to claim 5, further comprising a package, wherein a first chip component that constitutes the first surface acoustic wave filter and a second chip component that constitutes the second surface acoustic wave filter and the one-port surface acoustic wave resonator are mounted in the package.

8. A surface acoustic wave demultiplexer module, comprising the surface acoustic wave demultiplexer according to claim 7.

9. A surface acoustic wave demultiplexer module, comprising the surface acoustic wave demultiplexer according to claim 4.

10. A surface acoustic wave demultiplexer module, comprising the surface acoustic wave demultiplexer according to claim 1.

11. The surface acoustic wave demultiplexer according to claim 1, wherein the one-port surface acoustic wave resonator includes a third piezoelectric substrate and the first piezoelectric substrate and the third piezoelectric substrate are integrated such that the first surface acoustic wave filter and the one-port surface acoustic wave resonator are disposed on a single common piezoelectric substrate so as to define a chip component.

12. A surface acoustic wave demultiplexer module, comprising the surface acoustic wave demultiplexer according to claim 11.

13. The surface acoustic wave demultiplexer according to claim 1, wherein the first piezoelectric substrate is a LiTaO$_3$ substrate and the second piezoelectric substrate is a LiNbO$_3$ substrate.

14. A method of manufacturing a surface acoustic wave demultiplexer module comprising the steps of:

forming a first surface acoustic wave filter having a first piezoelectric substrate, an input terminal and an output terminal;

forming a second surface acoustic wave filter having a second piezoelectric substrate, an input terminal and an output terminal, the second surface acoustic wave filter having a higher center frequency than the first surface acoustic wave filter; and forming a one-port surface acoustic wave resonator connected to the input terminal of the first surface acoustic wave filter in series and having an anti-resonant frequency in the stop band of the first surface acoustic wave filter; wherein the first piezoelectric substrate of the first surface acoustic wave filter and the second piezoelectric substrate of the second surface acoustic wave filter are made of different piezoelectric materials.

15. The method according to claim 14, wherein the first piezoelectric substrate is a $LiTaO_3$ substrate and the second piezoelectric substrate is a $LiNbO_3$ substrate.

16. The method according to claim 14, further comprising the steps of preparing a package having an opening, and disposing the first surface acoustic wave filter, the second surface acoustic wave filter and the one-port surface acoustic wave resonator in the opening of the package.

17. The method according to claim 16, further comprising the steps of mounting a cover on the package, sealing an interior of the package and cover to form a surface acoustic wave demultiplexer, and mounting the surface acoustic wave demultiplexer on a printed circuit board.

18. The method according to claim 17, further comprising the steps of mounting inductors on the printed circuit board.

* * * * *